United States Patent [19]

Chen et al.

[11] Patent Number: 4,917,467
[45] Date of Patent: Apr. 17, 1990

[54] ACTIVE MATRIX ADDRESSING ARRANGEMENT FOR LIQUID CRYSTAL DISPLAY

[75] Inventors: Hsiung-Ku Chen, Taipei; Ting-Sing Wang, Hsin-Chu; Chia-Wei Hao, Taipei, all of Taiwan

[73] Assignee: Industrial Technology Research Institute, Taiwan

[21] Appl. No.: 207,753

[22] Filed: Jun. 16, 1988

[51] Int. Cl.$^4$ .............................................. G02F 1/13
[52] U.S. Cl. ..................................... 350/332; 350/333
[58] Field of Search ................. 350/332, 333; 340/784

[56] References Cited

U.S. PATENT DOCUMENTS

| | | | |
|---|---|---|---|
| 4,666,252 | 5/1987 | Yaniv et al. | 350/333 |
| 4,748,445 | 5/1988 | Togaski et al. | 340/784 |
| 4,775,861 | 10/1988 | Saito | 350/333 X |
| 4,781,438 | 11/1988 | Noguchi | 350/333 X |

FOREIGN PATENT DOCUMENTS 0057217 4/1984 Japan .
0081621 5/1984 Japan .
0107330 6/1984 Japan .

Primary Examiner—Stanley D. Miller
Assistant Examiner—Huy K. Mai
Attorney, Agent, or Firm—Darby & Darby

[57] ABSTRACT

A TFT LCD device is comprised of four TFT's with two separate sources, two separate drains and one common source-drain which is shared by the four respective TFT's, either acting as source or drain. The gate structure employs only one gate line with a bypass line. By sharing of the Si island and the centralization of the gate electrode of four TFT's, the pixel open ratio increases quite substantially. The devices are connected to the two adjacent pixels separated by the gate line via the two drain electrodes. Each pixel electrode is connected to the two adjacent devices via the two drain electrodes. Each pixel electrode can receive the data signals which are controlled by the two adjacent devices, to form a redundant structure for improving the yield of the TFT LCD. The common source-drain is situated along the gate bus line, and doesn't occupy too much of the pixel area, to thereby provide a large open ratio.

17 Claims, 6 Drawing Sheets

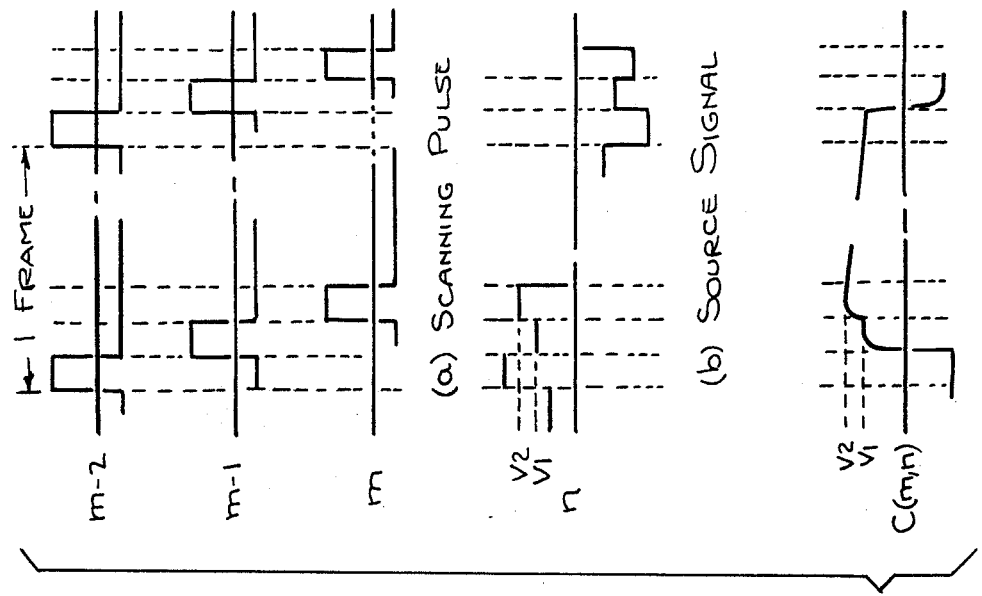
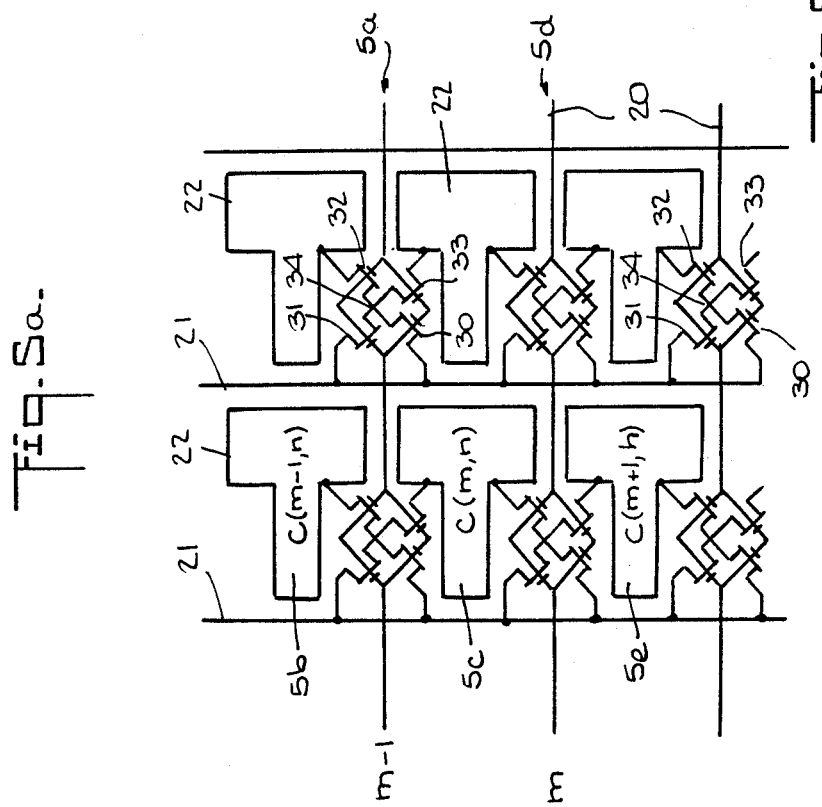

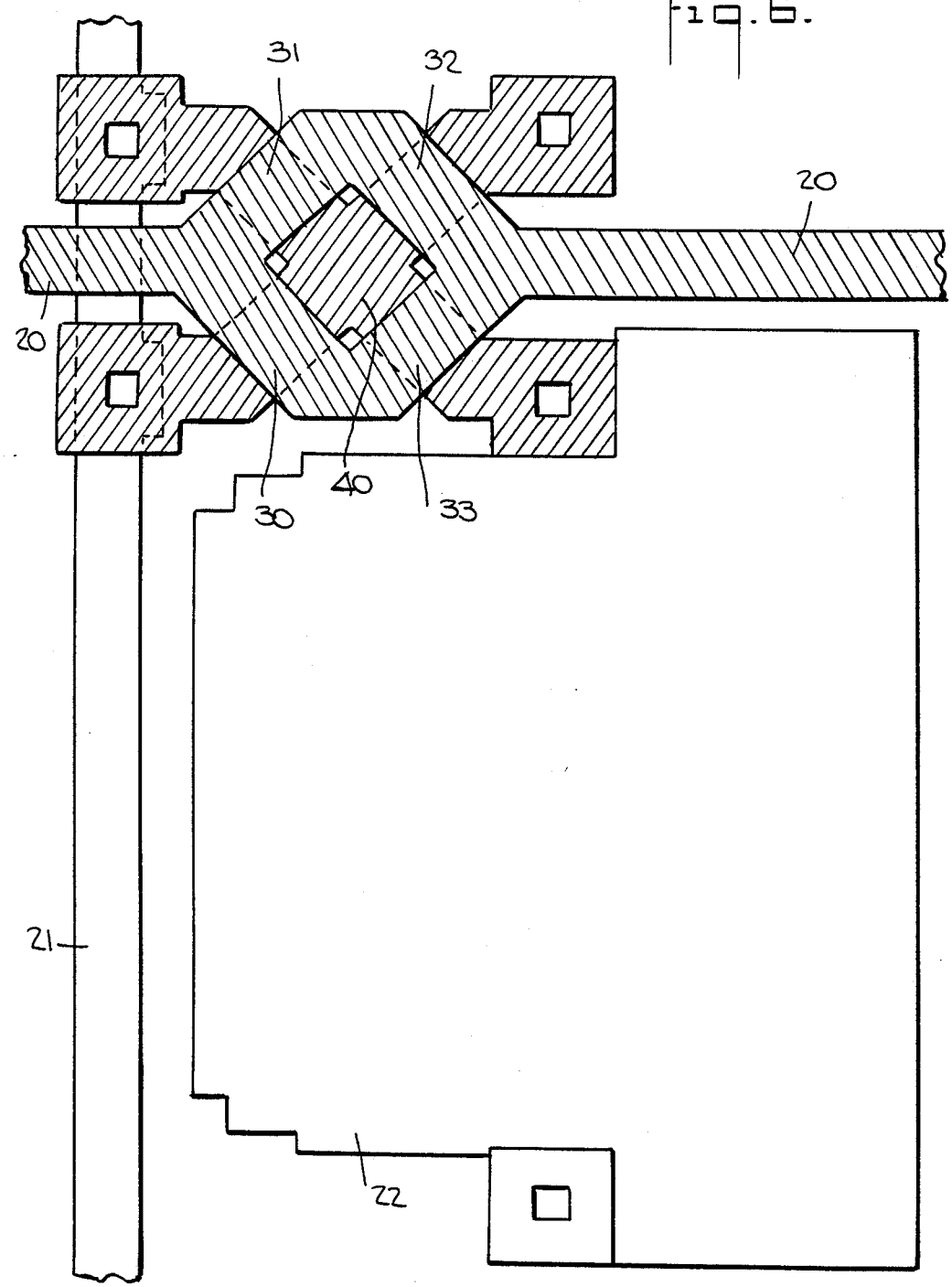

ACTIVE MATRIX ADDRESSING ARRANGEMENT FOR LIQUID CRYSTAL DISPLAY

BACKGROUND OF THE INVENTION

This invention relates to semiconductor devices, and is more in particular directed to the provision of a thin film transistor arrangement especially adapted for addressing the elements of a liquid crystal display.

In general, matrix addressing techniques for liquid crystal displays can be classified as employing either a multiplexing matrix or an active matrix. In an active matrix a stitching device is provided at each pixel of the display. This switching device can be a two terminal device, such as a metal-insulator-metal device (MIM), a back-to-back diode, or diode ring, or a three terminal device, such as a thin film transistor (TFT). The circuit design in the display panel employing two terminal devices is simpler than for three terminal devices. The gray scale controllability for achieving better image quality in the two terminal devices, however, is inferior to that achieved with three terminal devices. Therefore, in order to achieve high quality of reproduction in flat panel LCD TV displays, it is desirable to use thin film transistor devices.

As the display size, and hence the number of pixels, increases, the yield of TFT arrays drastically decreases due to various defects produced during the TFT fabrication process. For large flat panel displays, the number of gate and source bus lines increases and also the total line length of both bus lines increases substantially. The occurrence of defects such as discontinuities in the bus line also increases. It is therefore desirable to provide a panel circuit design that improves the LCD yield in such arrangements.

FIG. 1 illustrates the structure of a known TFT LCD addressing system with one TFT 1a for each pixel 1b. In the illustrated circuit, if, for example, the gate line (1c) is open, then the pixels starting from the defective point will not receive any signal and these pixels will be off all of the time. This will cause a line defect that can be easily distinguished by human eyes.

To solve this problem, various redundant structures have been proposed. For example, Matsushita Electric, Japan Display 86, p204–207, suggests the structure illustrated in FIG. 2, wherein each pixel responds to a pair of TFT's 2a controlled by the adjacent scanning gate lines 2b. In this arrangement, no additional gate or source lines 2c are necessary. When gate line 2d is open, the pixels between the gate line 2d and the adjacent gate line 2e will also receive the signals which are controlled by the gate line 2e, unless the gate line 2e is also defective. Therefore, the line defect caused by the open gate line can be eliminated by using this two transistor structure. The pixel open ratio in this display structure decreases, however, due to the increase in the area occupied by the TFT. The pixel open ratio is defined as the pixel area which can be lit in proportion to the whole display area. When the pixel open ratio decreases, display qualities such as brightness, color, etc., become degraded.

In order to reduce TFT junction leakage current, the dual gate structure shown in FIG. 3 may be used. The two TFT's 3a are connected in series as switch devices. If this dual gate structure is combined with the arrangement illustrated in FIG. 2, the arrangement of FIG. 4 will result, wherein the pixel open ratio of this LCD panel is significantly decreased.

European Patent Application document EP No. 182645 also discloses the circuit arrangement for a liquid crystal display as shown in FIG. 2 of the present application, as well as other arrangements employing two or three transistors for each pixel. The reference discloses further arrangements wherein transistors are connected so that a common junction occurs between the source/drain electrodes of four transistors, with two of the remaining source/drain electrodes being connected to the same signal line and the remaining source/drain elements being connected to separate pixel elements.

In further known art, Patent Document EP No. 102296 discloses interconnections of matrices, which may include thin film transistors; patent document EP No. 196915 describes a thin film transistor array that is limited to the structure of the individual transistors: and Patent Document EP No. 85402489 discloses an array. As will be apparent, these references do not suggest the structure and concept of the present invention.

SUMMARY OF THE INVENTION

The present invention is therefore directed to the provision of a redundant device for preserving the advantage of the dual gate structure without decreasing the pixel open ratio in an LCD panel.

Briefly stated, the device in accordance with the invention is comprised of four TFT's connected to define two separate sources, two separate drains and one common source-drain shared by the four respective TFT's, either acting as a source or drain. Only one gate line, with a bypass line, is used for the gate structure. Due to the sharing of the Si island and the centralization of the gate electrode of four TFT's, the pixel open ratio is increased quite substantially. The devices are connected to the two adjacent pixels between which a gate line extends via the two separate drain electrodes. Each pixel electrode is connected to the two adjacent devices via the two drain electrodes. Each pixel electrode can receive the data signals which are controlled by the two adjacent devices, the redundant structure for improving the yield of the TFT LCD being formed accordingly. The common source-drain is situated along the gate bus line, and it occupies a minimum of space of the the pixel area. As a consequence, the device in accordance with the invention has a large open ratio.

The TFT LCD device in accordance with the invention provides large pixel open ratio yet maintains the advantages of dual gate structures. It also solves the line defect problem by using the redundant structure.

BRIEF FIGURE DESCRIPTION

In order that the invention may be more clearly understood, it will now be disclosed in greater detail with reference to the accompanying drawings, wherein:

FIG. 5a illustrates a device in accordance with the invention, employing a TFT LCD with two dual TFT's for each pixel;

FIG. 5b is a signal time chart for the gate, source and liquid crystal pixel of the device of FIG. 5a;

FIG. 6 is a plan view of a portion of a TFT LCD structure in accordance with the invention, with two dual TFT's for each pixel;

Figure 9:
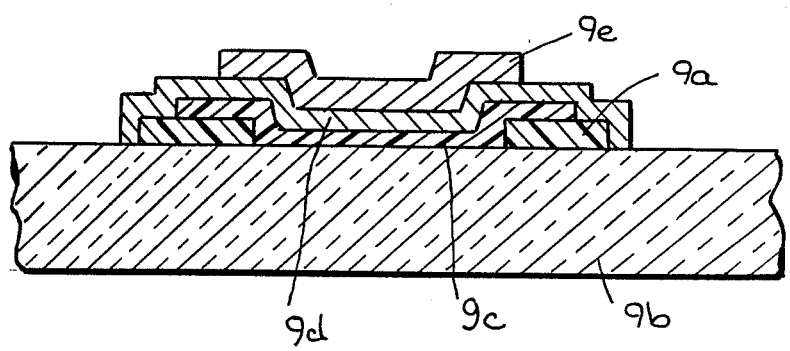
Figure 10:
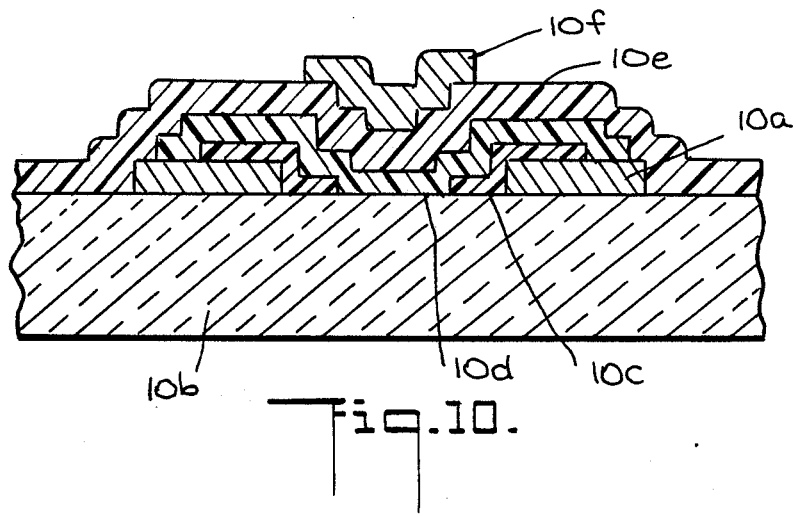
Figure 11:
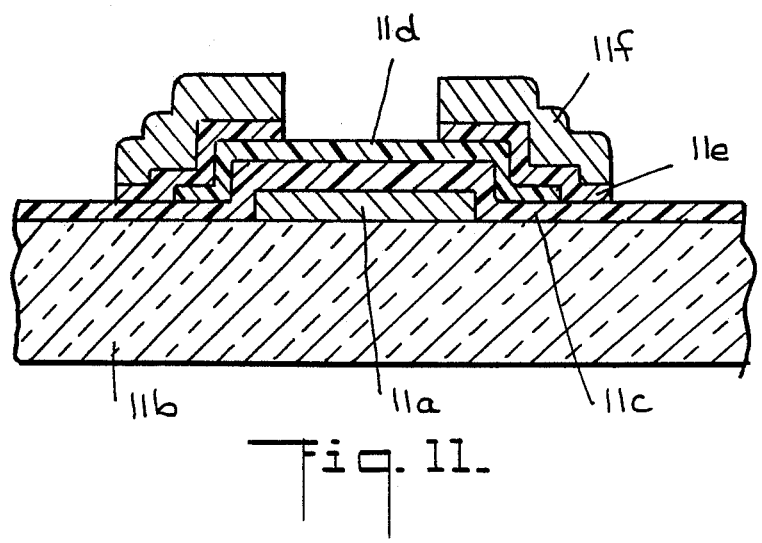

FIG. 9 illustrated the cross section of staggered poly-Si thin film transistors;

FIG. 10 illustrates the cross section of staggered amorphous-Si thin film transistors; and FIG. 11 illustrates the cross section of inverted-staggered amorphous-Si thin film transistor.

DETAILED DISCLOSURE OF THE INVENTION

A schematic diagram of one embodiment of the invention is illustrated in FIG. 5a, and a plan view of a portion of this arrangement is illustrated in FIG. 6. The basic concept of this construction is that each pixel is connected to receive two different signals successively via the two switch devices in one frame period. Of these signals, only the last applied signal will drive the LCD pixel effectively. FIG. 5b is a timing chart of the signals on the gate, source and liquid crystal pixel.

As illustrated in FIG. 5a, the circuit includes a matrix of a plurality of parallel gate lines 20 and a plurality of parallel source data lines 21 extending perpendicularly to the gate lines 20, the gate and data lines defining a plurality of spaces. A display electrode 22 is provided in each of the spaces, so that the gate lines extend between adjacent rows of electrodes and the data lines extend between adjacent columns of electrodes.

The addressing circuit of the invention includes groups of four transistors, such as the transistors 30, 31, 32 and 33. The source-drain paths of two of the transistors 30 and 31 are connected between a data line and a common junction 34, and the source-drain paths of the other two transistors 32 and 33 of each group are connected between the respective common junction 34 and separate electrodes 22 in a common column and on opposite sides of one of the gate lines. The gates of the transistors are all connected to the same gate line between the latter electrodes. The circuit thus simulates a bridge circuit. In each case, however, each of the electrodes is connected to a transistor from each of two of the transistor groups.

In FIG. 5b, scanning pulses applied to three of the gate lines are shown at the top of the figure, showing that each gate line is pulsed once during a frame. The source data signal illustrated in FIG. 5b represents a typical signal voltage that may be applied to one of the source data lines n. The bottom diagram illustrated the voltage maintained at the C(m,n) pixel electrode 5c.

The manner of operation of the arrangement of FIG. 5a will now be explained. When employing a line-at-a-time driving scheme, and the (m-1)th gate line 5a is selected, the respective TFT's of the C(m-1,n) pixel 5b and the C(m,n) pixel 5c are driven so that the data signal V1 is simultaneously applied to these two adjacent pixels 5b and 5c. When the mth gate line 5d is selected, the data signal V2 (FIG. 5b) will apply to the C(m,n) pixel 5c and the adjacent C(m+1,n) pixel 5e. Although the C(m,n) pixel 5c receives two signals, only the last signal V2 can be held by the pixel until the respective TFT's of the C(m,n) pixel 5c is again selected in the next frame period. Since the applied period of the signal V1 is very short in comparison with the applied period of the signal V2 which is nearly equal to a frame period, the drive of the pixel is equivalent to the drive of a conventional one dual gate per pixel device, and the complete data picture is displayed. If the mth gate line 5d is open, the C(m,n) pixel 5c will hold the data signal V1 instead of data signal V2. This difference can not be readily distinguished by human eyes when TV images are displayed since the adjacent data signals have close correlations with respect to each other.

A typical configuration of the circuit is illustrated in FIG. 6, wherein it is seen that the gate bus lines 20 may be formed as centrally open generally square layer in the regions of the transistors, with a central area 40 defining the common junctions of the source-drain paths of the transistors. Two of the transistors are also connected to a common data line 21, and the remaining electrodes of the other two transistors are connected to separate electrodes 22, only one of which appears in FIG. 6. The illustrated paths are of course electrically isolated in accordance with conventional practice.

Figure 1:
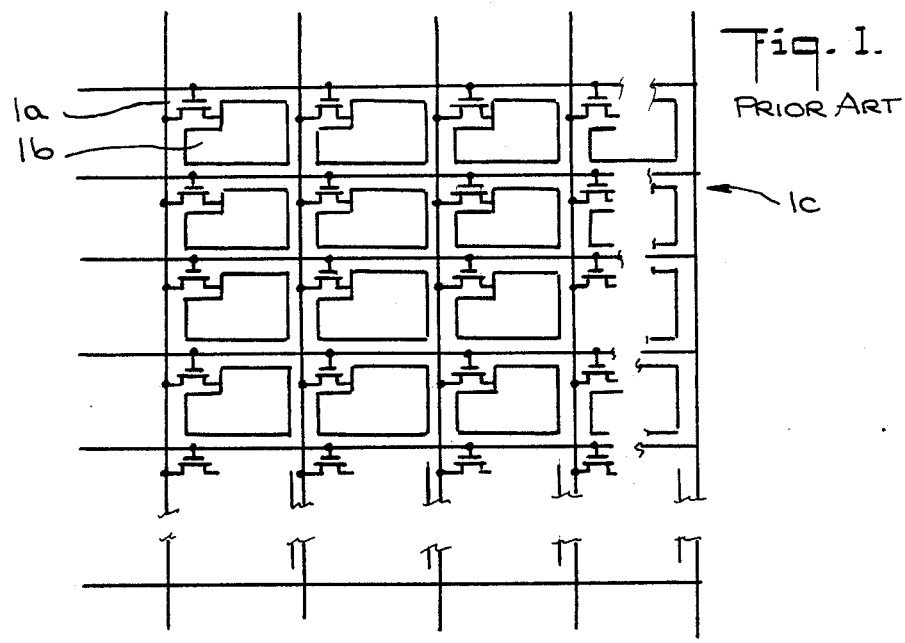
FIG. 1 illustrates the structure of a TFT LCD with one TFT for each pixel.
Figure 2:
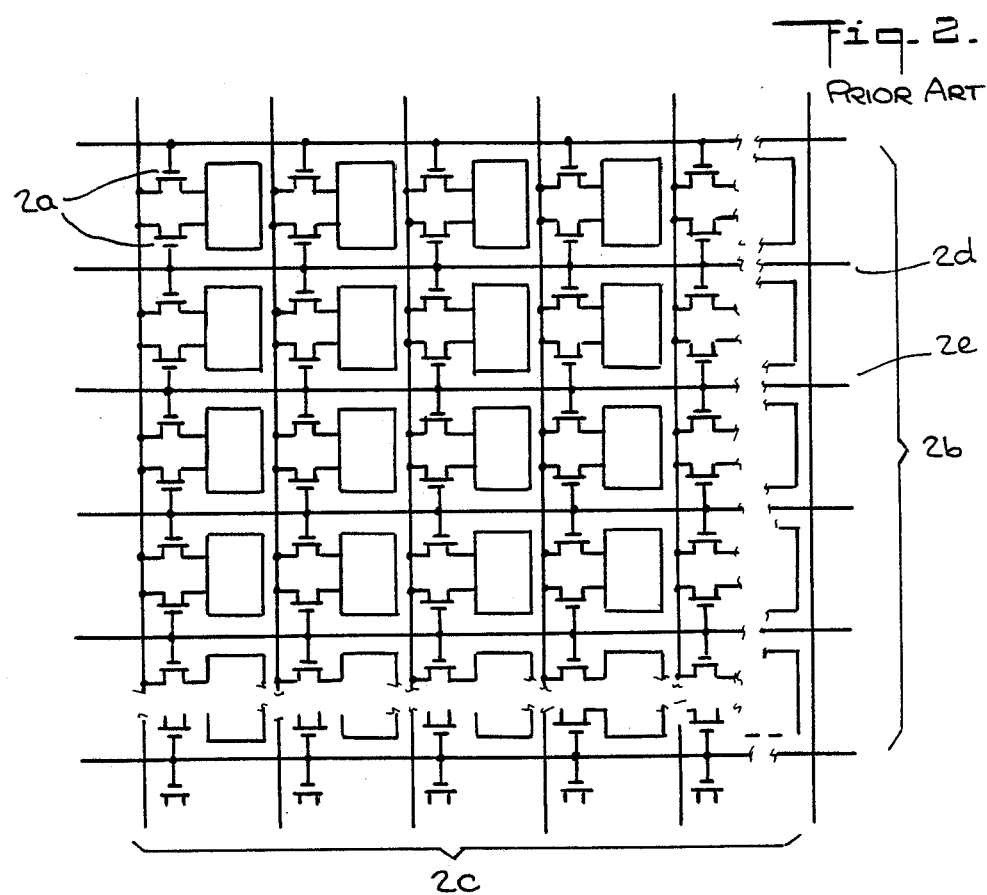
FIG. 2 illustrates the structure of a TFT LCD with two TFT's for each pixel.
Figure 3:
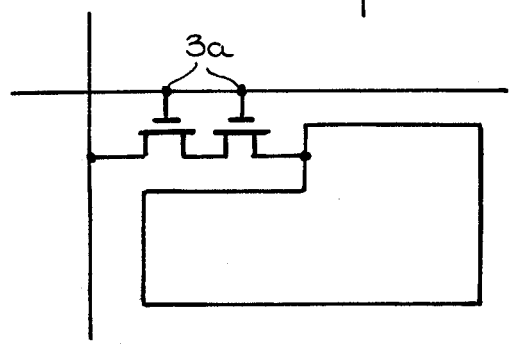
FIG. 3 illustrates the structure of a dual gate TFT.
Figure 4:
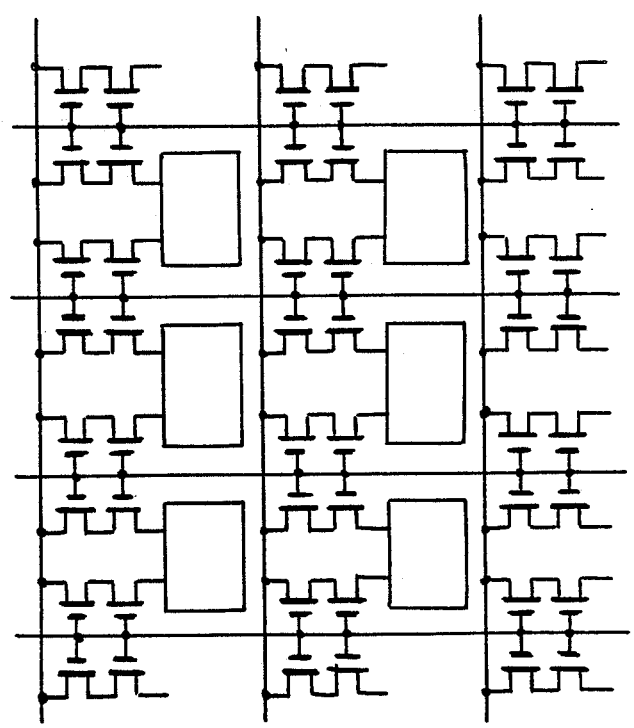
FIG. 4 illustrates the structure of a TFT LCD with two dual TFT's for each pixel.
Figure 7:
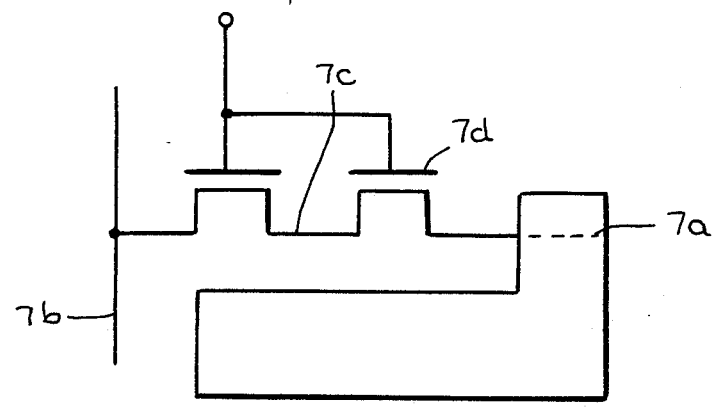
FIG. 7 illustrates the leakage current reduction of a dual gate transistor.

The reason for leakage current reduction of dual gate transistors is apparent from FIG. 7. As illustrated, when the leakage current flows from the pixel 7a to the data source line 7b, a positive potential will exist at the point 7c. Therefore Vgs(Vg-Vs) will become negative during the time that the gate line is nonselected with zero potential. Due to the positive threshold voltage for NMOS devices, this neqative voltage Vgs will make leakage current flow through the second thin film transistor 7d very difficult.

The LCD active matrix device in accordance with the invention can employ coplanar poly-Si thin film transistors, staggered poly-Si thin film transistors, staggered amorphous-Si thin film transistors or inverted-staggered amorphous-Si thin film transistors. These four thin film transistor structures will now be briefly discussed.

Thin film transistors can be classified according to the material used for the semiconductor and gate insulator and by the thin film transistor structure, depending upon the order of the deposition of the semiconductor layer, the gate insulator, the source drain electrode and the gate electrode. In a coplanar structure, the source-drain and gate electrode are on the same side of the semiconductor film. In a staggered structure the source drain electrode is located on the opposite side of the semiconductor film as the gate electrode, with the gate electrode above the semiconductor film. An inverted staggered structure is the same as a staggered structure except that the gate electrode is situated below the semiconductor film.

Figure 8:
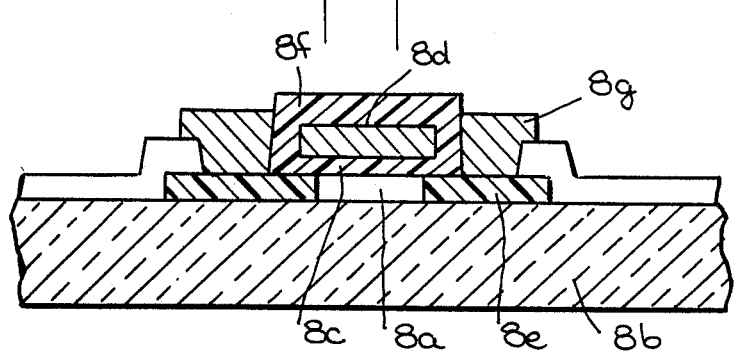
FIG. 8 illustrates the cross section of a coplanar poly-Si thin film transistor.

A coplanar poly-Si thin transistor structure is illustrated in FIG. 8. It is processed by first depositing a low pressure CVD (LPCVD) polysilicon semiconductor film or a low temperature (560 deg. C.) low pressure CVD amorphous-Si semiconductor film 8a on a transparent substrate 8b such as quartz or glass material or a silicon wafer deposited with CVD silicon oxide film or thermal oxide film. This semiconductor film is then patterned. A thermal oxide layer 8c on the poly-Si film is used for the gate insulator. The phosphorus doped poly-Si film 8d is then deposited and patterned as gate material. The n type or p type dopant is self-aligned ion implanted, to serve as a source-drain contact. The metal is then sputtered or evaporated and patterned as the source drain electrode 8g.

A staggered poly-Si thin film transistor structure is illustrated in FIG. 9. In the production of this structure, first the phosphorus doped LPCVD poly-Si film 9a is deposited and patterned as a source drain electrode on a transparent substrate or a Si-wafer 9b deposited with CVD silicon oxide or thermally grown oxide. The undoped LPCVD polysilicon film or undoped low temperature (560 deg C.) LPCVD amorphous-Si film 9c is deposited and patterned as the channel region. Then a thermal oxide layer 9d is thermally grown over this semiconductor film to be used as the gate insulator. Next a metal layer 9e, such as aluminum, is sputtered or evaporated and patterned as the gate electrode.

A staggered amorphous-Si thin film transistor structure is illustrated in FIG. 10. In the production of this structure, first the metallic source-drain electrodes 10a are deposited and patterned on the transparent substrate or Si wafer 10b deposited with CVD silicon oxide by sputtering or evaporation. Then a phosphorus doped amorphous-Si film 10c is deposited using plasma-enhanced chemical vapor deposition techniques (PECVD). This n type deposited layer is patterned as a source drain contact in order to provide good current injection properties. Next a PECVD undoped amorphous-Si film 10d is deposited and patterned, followed by gate insulator 10e deposition which can be either CVD silicon oxide, PECVD silicon nitride, or PECVD silicon oxide. The metal layer, such as aluminum, is then sputtered or evaporated and patterned as the gate electrode 10f.

An inverted-staggered amorphous-Si thin film transistor is shown in FIG. 11. This structure is processed by first sputtering or evaporating and patterning the metal gate electrode 11a on the transparent substrate or Si wafer 11b deposited with CVD silicon oxide film. The gate dielectric material 11c, such as PECVD silicon nitride or PECVD silicon nitride, is then deposited, followed by PECVD undoped amorphous-Si deposition 11d. Next the amorphous-Si layer is patterned as a channel layer. Then PECVD phosphorus doped amorphous-Si layer 11e is deposited and the metal layer 11f is sputtered or evaporated. Then the metal layer is etched to form the source-drain electrode 11f, and the n type amorphous Si layer is patterned successively to form the source drain contact 11e to the undoped amorphous-Si layer 11d.

In the circuit of the present invention, as opposed to the arrangement disclosed in the above discussed patent document EP No. 182646, wherein the common junction is connected to a pixel element between the other two pixel elements, the two remaining source drain elements are connected to adjacent pixel elements and the common junction is not connected to any pixel element. The circuit of the reference thus employs three transistors for each pixel element, as opposed to the four transistor bridge circuit of the invention.

While the invention has been disclosed and described with reference to a limited number of embodiments, it will be apparent that variations and modifications may be made therein. It is therefore intended in the following claims to cover each such variation and modification as falls within the true spirit and scope of the invention.

What is claimed is:

1. A device for providing redundant matrix addressing of a liquid crystal material, comprising:

first, second, third and fourth thin film transistors, each of said transistors having a source and a drain, one of said source and drain from each of said transistors being electrically directly connected together, said connection being physically a commonly shared portion of thin film material, and each of said transistors having a gate positioned to act between the respective transistor source and drain;

a gate line connected to each said gate, a first portion of said gate line being physically split into two electrically parallel branches, said branches separating and coming together in said first portion of said gate line leaving an open space between said branches, said commonly shared portion of thin film material being positioned in said open space;

a first load electrode and a second load electrode and a data bus line being associated with said device, the other side of said source and drain which is not connected to said commonly shared portion of thin film material of said first transistor and said fourth transistor connects to said data bus line, the other of said source and drain not connected to said commonly shared portion of thin film material of said second transistor being connected to said first load electrode, the other of said source and drain not connected to said commonly shared portion of thin film material of said third transistor being connected to said second load electrode.

2. The device of claim 1 wherein each said thin film transistor comprises a coplanar poly-Si thin film transistor.

3. The device of claim 1 wherein each said thin film transistor comprises a staggered poly-Si thin film transistor.

4. The device of claim 1 wherein each said thin film transistor comprises a staggered amorphous-Si thin film transistor.

5. The device of claim 1 wherein each said thin film transistor comprises an inverted-staggered amorphous-Si thin film transistor.

6. The device of claim 1 wherein said commonly shared portion of thin film material is situated in physical alignment with the gate line.

7. A device as claimed in claim 1 wherein said gates of said first and said second transistors connect to one of said gate branches and said gates of said third and said fourth transistors connect to the other said gate branch.

8. A matrix display panel for active matrix addressing, said panel having a plurality of gate lines, a plurality of data bus lines and a plurality of pixel electrodes, said gate and data bus lines being transverse with respect to each other, comprising:

a plurality of switch devices, each said switch device including first, second, third and fourth thin film transistors, each said transistor having a source and a drain, one of said source and drain from each said transistor being electrically directly connected together, said connection being physically a commonly shared portion of thin film material, each said transistor having a gate positioned to act between the respective transistor source and drain, one said gate line being connected to each said gate, a first portion of said gate line being physically split into two electrically parallel branches, said branches separating and coming together in said first gate line portion leaving an open space between said branches, said commonly shared portion of thin film material being positioned in said open space, a first pixel electrode and a second pixel electrode being associated with each said switch device, the first said pixel electrode being physically on one side of said gate line and the second said pixel electrode being on the opposite side of said gate line, the other of said source and drain which is not connected to said commonly shared portion of thin film material of said first transistor and said fourth transistor connect to one said data but line, the other of said source and drain not connected to said commonly shared portion of thin film material of said second transistor being connected to said first pixel electrode, the other of said source and drain not connected to said commonly shared portion of thin film material of said third transistor being connected to said second pixel electrode.

9. The panel of claim 8 wherein each said thin film transistor comprises a coplanar poly-Si thin film transistor.

10. The panel of claim 8 wherein each said thin film transistor comprises a staggered poly-Si thin film transistor.

11. The panel of claim 8 wherein each said thin film transistor comprises a staggered amorphous-Si thin film transistor.

12. The panel of claim 8 wherein each said thin film transistor comprises an inverted-staggered amorphous-Si thin film transistor.

13. The panel of claim 8 wherein said commonly shared portion of thin film material is situated in physical alignment with the gate line.

14. A matrix display panel as claimed in claim 8, wherein said connections to said data bus line are on opposite sides physically of said one gate line.

15. A device as claimed in claim 8 wherein said gates of said first and said second transistors connect to one said gate branch and said gates of said third and said fourth transistors connect to the other said gate branch.

16. An addressing circuit for an LCD display, said display having a plurality of display electrodes arranged in vertical columns and horizontal rows, a grid of gate lines positioned between adjacent electrode rows and data lines positioned between adjacent electrode columns, comprising:

a first, second, third and a fourth thin film transistor, each said transistor having a source, drain and gate electrode;

connective means for electrically connecting the sources of said first and fourth transistors to the same adjacent data line, the drains of said first and fourth transistors being electrically connected at a common junction;

connective means for electrically connecting the drains of said second and third transistors respectively to adjacent display electrodes, said adjacent display electrodes being in the same column, one said gate line being positioned intermediate said adjacent electrodes, the sources of said second and third transistors being electrically connected at said common junction; and connective means for connecting the gates of said four transistors to said intermediate gate line.

17. An addressing circuit as claimed in claim 16 wherein said intermediate gate line is physically split over a portion of its length into two electrically parallel branches, said branches separating and coming together in said length of said gate line portion leaving an open space therebetween, the gate electrodes of said first and second transistors being connected to one said branch and the gate electrodes of said third and fourth transistors being connected to the other said branch, said branches overlaying and crossing said respectively connected transistors between the sources and drains thereof.

* * * * *